US009761442B2

(12) United States Patent
Iwamoto et al.

(10) Patent No.: US 9,761,442 B2
(45) Date of Patent: Sep. 12, 2017

(54) PROTECTIVE FILM FORMING METHOD FOR FORMING A PROTECTIVE FILM ON A WAFER

(71) Applicant: DISCO CORPORATION, Tokyo (JP)

(72) Inventors: Taku Iwamoto, Tokyo (JP); Hiroto Yoshida, Tokyo (JP); Junichi Kuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/348,448

(22) Filed: Nov. 10, 2016

(65) Prior Publication Data

US 2017/0140928 A1 May 18, 2017

(30) Foreign Application Priority Data

Nov. 16, 2015 (JP) .................... 2015-223930

(51) Int. Cl.
| | |
|---|---|
| *H01L 21/31* | (2006.01) |
| *H01L 21/469* | (2006.01) |
| *H01L 21/02* | (2006.01) |
| *H01L 21/683* | (2006.01) |
| *H01L 21/67* | (2006.01) |
| *H01L 33/00* | (2010.01) |
| *H01S 5/02* | (2006.01) |

(52) U.S. Cl.
CPC .... *H01L 21/02282* (2013.01); *H01L 21/0206* (2013.01); *H01L 21/02118* (2013.01); *H01L 21/67051* (2013.01); *H01L 21/6836* (2013.01); *H01L 33/0095* (2013.01); *H01L 2221/68327* (2013.01); *H01S 5/0201* (2013.01)

(58) Field of Classification Search
CPC ................. H01L 21/30; H01L 21/6715; H01L 21/67017; H01L 21/67023; H01L 21/67028; H01L 21/6704; H01L 21/67051; H01L 21/6835; H01L 21/6836; H01L 21/02282; H01L 21/0206; H01L 21/02118; H01L 2221/68327; H01L 33/0095
See application file for complete search history.

(56) References Cited

U.S. PATENT DOCUMENTS

| 2005/0054274 A1* | 3/2005 | Kajiyama | ............. B24B 37/042 |
| | | | 451/41 |
| 2006/0094210 A1* | 5/2006 | Kajiyama | ............. B24B 37/042 |
| | | | 438/460 |
| 2014/0220862 A1* | 8/2014 | Koike | ................... B24B 37/013 |
| | | | 451/5 |

FOREIGN PATENT DOCUMENTS

JP         2004-322168         11/2004

* cited by examiner

*Primary Examiner* — Thanh Y Tran
(74) *Attorney, Agent, or Firm* — Greer Burns & Crain, Ltd.

(57) ABSTRACT

A method for forming a water-soluble resin film on a wafer having a plurality of devices thereon. The wafer is supported through an adhesive tape to an annular frame. The method includes removing the resin scattered onto the surface of the frame in forming the film on the wafer held on a spinner table, and this step further includes: rotating the spinner table; positioning a water nozzle above the frame held on the spinner table, supplying water from the nozzle to the frame, positioning an air nozzle adjacent to the water nozzle on the downstream side thereof in the rotational direction of the spinner table, and supplying air from the air nozzle against the flow of the water on the frame, whereby the water is forced to temporarily stay on the surface of the frame by the air supplied and is then expelled outward of the frame.

1 Claim, 8 Drawing Sheets

PROTECTIVE FILM FORMING METHOD FOR FORMING A PROTECTIVE FILM ON A WAFER

BACKGROUND OF THE INVENTION

Field of the Invention

The present invention relates to a protective film forming method for forming a protective film on the front side of a wafer such as a semiconductor wafer.

Description of the Related Art

As well known in the art, in a semiconductor device fabrication process, a plurality of crossing division lines are formed on the front side of a semiconductor substrate such as a silicon substrate to thereby define a plurality of separate regions where a plurality of devices such as integrated circuits (ICs) and large scale integrations (LSIs) are each formed. Such a wafer having the plural devices formed on the front side of the semiconductor substrate is cut along the division lines to thereby obtain individual device chips. Further, in an optical device wafer, the front side of a sapphire substrate or the like is partitioned into a plurality of separate regions by a plurality of crossing division lines, and a gallium nitride compound semiconductor or the like is layered in each separate region of the substrate to thereby form an optical device. Such an optical device wafer is divided along the division lines to obtain individual optical device chips such as light emitting diodes and laser diodes, which are widely used for electrical equipment.

As a method of dividing a wafer such as a semiconductor wafer and an optical device wafer along the division lines formed on the front side of the wafer, there has been proposed a method including the steps of applying a pulsed laser beam to the wafer along the division lines to thereby form a plurality of laser processed grooves and next breaking the wafer along these laser processed grooves by using a mechanical breaking apparatus.

Such laser processing has advantages over cutting such that a processing speed is higher and a wafer formed of a hard material such as sapphire can be processed relatively easily. However, when a laser beam is applied to the wafer along the division lines, thermal energy is concentrated at a region irradiated with the laser beam, causing the generation of debris, and this debris may stick to the surface of the devices formed on the wafer, causing a degradation in quality of the devices.

To solve this problem due to the debris, there has been proposed a laser processing apparatus having a configuration such that a protective film of resin such as polyvinyl alcohol (PVA) is formed on the front side (work surface) of a wafer and a laser beam is next applied through the protective film to the wafer (see Japanese Patent Laid-open No. 2004-322168, for example).

In the laser processing apparatus disclosed in Japanese Patent Laid-open No. 2004-322168, the protective film is formed by a so-called spin coating method including the steps of holding the wafer on a spinner table, supplying a water-soluble resin such as PVA to the center of the front side of the wafer held on the spinner table, and rotating the spinner table to thereby spread the water-soluble resin toward the outer circumference of the wafer due to a centrifugal force, thus forming the protective film on the front side of the wafer.

SUMMARY OF THE INVENTION

However, the protective film is formed on the front side of the wafer held on the spinner table in the condition where the back side of the wafer is attached to a protective tape supported to an annular frame. Accordingly, the water-soluble resin scatters and adheres to the upper surface of the annular frame in forming the protective film. As a result, there is a problem such that in transferring the wafer supported through the protective tape to the annular frame, the water-soluble resin adhering to the upper surface of the annular frame may act like an adhesive to interfere with the separation of the annular frame from transfer means.

To cope with this problem, there has been proposed a method including the steps of forming a protective film of a water-soluble resin on the front side of the wafer by using protective film forming means and next supplying a cleaning water to the water-soluble resin scattered onto the upper surface of the annular frame to thereby remove the water-soluble resin from the upper surface of the annular frame. However, considerable time is required to reliably remove the water-soluble resin from the upper surface of the annular frame, so that laser processing cannot be smoothly performed.

It is therefore an object of the present invention to provide a protective film forming method which can easily remove the water-soluble resin from the upper surface of the annular frame supporting the wafer through the protective tape.

In accordance with an aspect of the present invention, there is provided a protective film forming method for forming a protective film of a water-soluble resin on the front side of a wafer, the front side of the wafer being partitioned by a plurality of crossing division lines to thereby define a plurality of separate regions where a plurality of devices are each formed, the protective film forming method including a wafer supporting step of attaching the back side of the wafer to an adhesive tape supported to an annular frame having an inside opening for receiving the wafer, thereby supporting the wafer through the adhesive tape to the annular frame; a wafer holding step of holding the wafer supported through the adhesive tape to the annular frame on a spinner table in the condition where the front side of the wafer is oriented upward; a protective film forming step of rotating the spinner table and dropping the water-soluble resin onto the center of the front side of the wafer to thereby form the protective film of the water-soluble resin on the front side of the wafer; and a water-soluble resin removing step of removing the water-soluble resin scattered onto the upper surface of the annular frame in the protective film forming step; the water-soluble resin removing step including the steps of rotating the spinner table, positioning a cleaning water nozzle above the upper surface of the annular frame held on the spinner table, supplying a cleaning water from the cleaning water nozzle to the upper surface of the annular frame, positioning an air nozzle adjacent to the cleaning water nozzle on the downstream side thereof in the rotational direction of the spinner table, and supplying air from the air nozzle against the flow of the cleaning water on the upper surface of the annular frame, whereby the cleaning water is forced to temporarily stay on the upper surface of the annular frame by the air supplied and is then expelled outward of the annular frame.

As described above, the protective film forming method according to the present invention includes the water-soluble resin removing step of removing the water-soluble resin scattered onto the upper surface of the annular frame in the protective film forming step. The water-soluble resin removing step includes the steps of rotating the spinner table, positioning the cleaning water nozzle above the upper surface of the annular frame held on the spinner table, supplying a cleaning water from the cleaning water nozzle to the upper surface of the annular frame, positioning the air nozzle adjacent to the cleaning water nozzle on the downstream side thereof in the rotational direction of the spinner table, and supplying air from the air nozzle against the flow of the cleaning water on the upper surface of the annular frame, whereby the cleaning water is forced to temporarily stay on the upper surface of the annular frame by the air supplied and is then expelled outward of the annular frame. Accordingly, the water-soluble resin adhering to the upper surface of the annular frame is dissolved in the cleaning water temporarily staying on the upper surface of the annular frame, thereby improving a cleaning effect. As a result, the water-soluble resin adhering to the upper surface of the annular frame can be effectively removed in a short period of time. Accordingly, in transferring the wafer supported through the adhesive tape (protective tape) to the annular frame, there is no possibility that the water-soluble resin adhering to the upper surface of the annular frame may act like an adhesive to interfere with the separation of the annular frame from transfer means.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
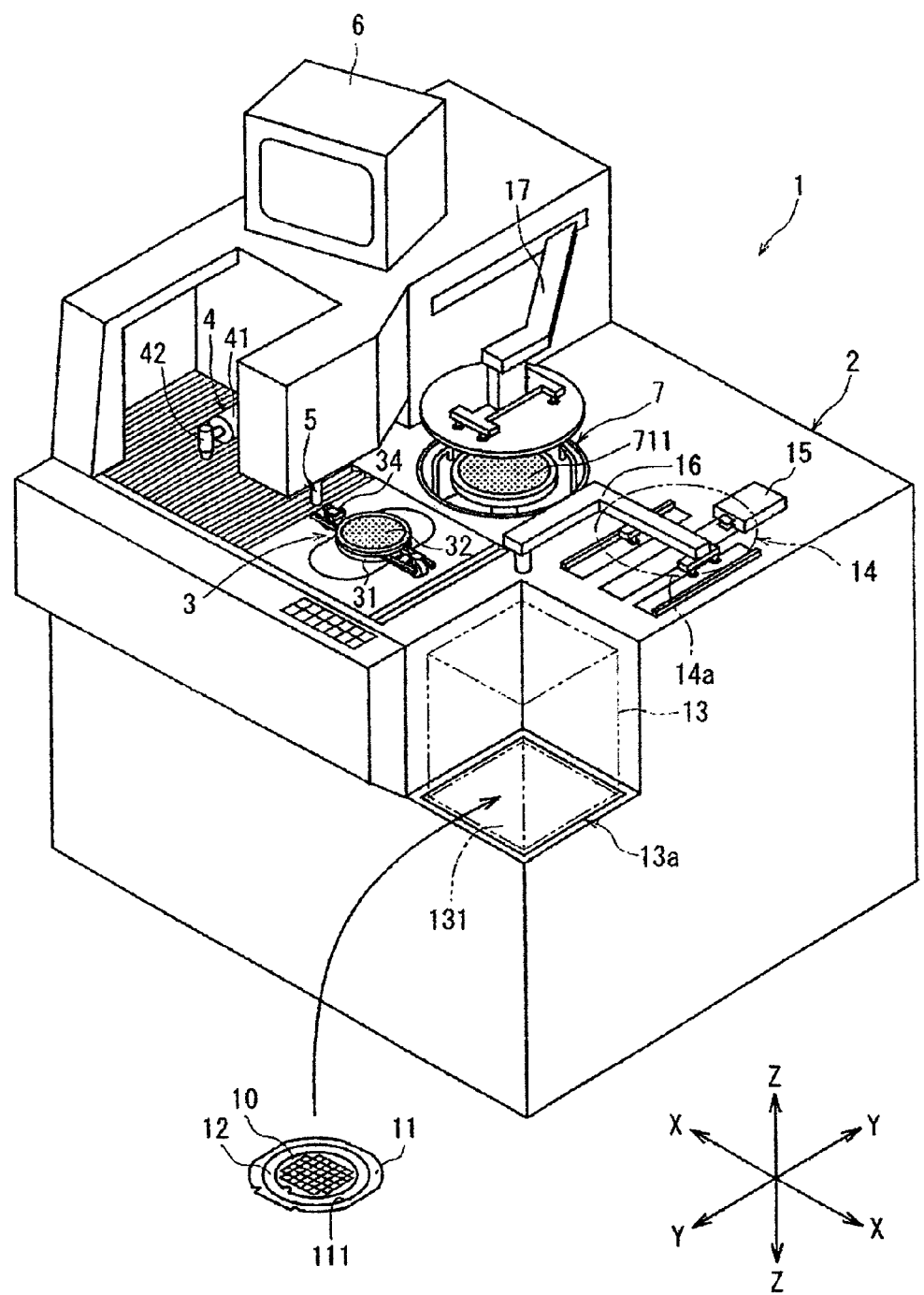
FIG. 1 is a perspective view of a laser processing apparatus including a protective film forming apparatus for performing the protective film forming method according to the present invention.

A preferred embodiment of the protective film forming method according to the present invention will now be described in detail with reference to the attached drawings. Referring to FIG. 1, there is shown a perspective view of a laser processing apparatus 1 including a protective film forming apparatus for performing the protective film forming method according to the present invention.

The laser processing apparatus 1 shown in FIG. 1 has a substantially boxlike housing 2. The housing 2 includes a chuck table 3 as workpiece holding means for holding a workpiece. The chuck table 3 is movable in the direction shown by an arrow X as a feeding direction. The chuck table 3 has a vacuum chuck support 31 and a vacuum chuck 32 mounted on the vacuum chuck support 31. The vacuum chuck 32 has an upper surface as a holding surface for holding a workpiece such as a disk-shaped semiconductor wafer thereon under suction by operating suction means (not shown). Further, the chuck table 3 is rotatable by a rotating mechanism (not shown). The vacuum chuck support 31 of the chuck table 3 is provided with a pair of clamps 34 for fixing an annular frame to be hereinafter described.

The laser processing apparatus 1 includes laser beam applying means 4. The laser beam applying means 4 includes laser beam oscillating means 41 for oscillating a laser beam and focusing means 42 for focusing the laser beam oscillated by the laser beam oscillating means 41.

The laser processing apparatus 1 further includes imaging means 5 for imaging the upper surface of the workpiece held on the vacuum chuck 32 of the chuck table 3 to detect a target area to be processed by the laser beam applied from the focusing means 42 of the laser beam applying means 4. The imaging means 5 includes an ordinary imaging device (charge-coupled device (CCD)) for imaging the workpiece by using visible light, infrared light applying means for applying infrared light to the workpiece, an optical system for capturing the infrared light applied by the infrared light applying means, and an imaging device (infrared CCD) for outputting an electrical signal corresponding to the infrared light captured by the optical system. An image signal output from the imaging means 5 is transmitted to control means (not shown). The laser processing apparatus 1 further includes displaying means 6 for displaying the image obtained by the imaging means 5.

The laser processing apparatus 1 further includes a protective film forming apparatus 7 for forming a protective film on the front side (work surface) of a wafer as a workpiece before processing. The protective film forming apparatus 7 will now be described with reference to FIGS. 2 to 4. The protective film forming apparatus 7 includes a spinner table mechanism 71 and spinner table accommodating means 72 provided so as to surround the spinner table mechanism 71. The spinner table mechanism 71 includes a spinner table 711, an electric motor 712 for rotationally driving the spinner table 711, and supporting means 713 for vertically movably supporting the electric motor 712. The spinner table 711 includes a vacuum chuck 711a formed of a porous material. The vacuum chuck 711a has an upper surface as a holding surface for holding the workpiece thereon under suction. The vacuum chuck 711a is connected to suction means (not shown). Accordingly, the spinner table 711 functions to hold the wafer as a workpiece placed on the vacuum chuck 711a by using a vacuum produced by the suction means.

The vacuum chuck 711a of the spinner table 711 has an outer diameter larger than the inner diameter of the annular frame (to be hereinafter described) and smaller than the outer diameter of the annular frame. Accordingly, when the annular frame is held on the upper surface of the spinner table 711, the peripheral portion of the annular frame projects outward from the outer circumference of the vacuum chuck 711a of the spinner table 711. The electric motor 712 has a drive shaft 712a, and the spinner table 711 is connected to the upper end of the drive shaft 712a. The supporting means 713 is composed of a plurality of (three in this preferred embodiment) support legs 713a and a plurality of (three in this preferred embodiment) air cylinders 713b operatively connected to the support legs 713a. All of the air cylinders 713b are mounted on the electric motor 712. The supporting means 713 functions in such a manner that the air cylinders 713b are operated to vertically move the electric motor 712 and the spinner table 711 between the upper position shown in FIG. 3 as a standby position and the lower position shown in FIG. 4 as a working position.

Figure 2:
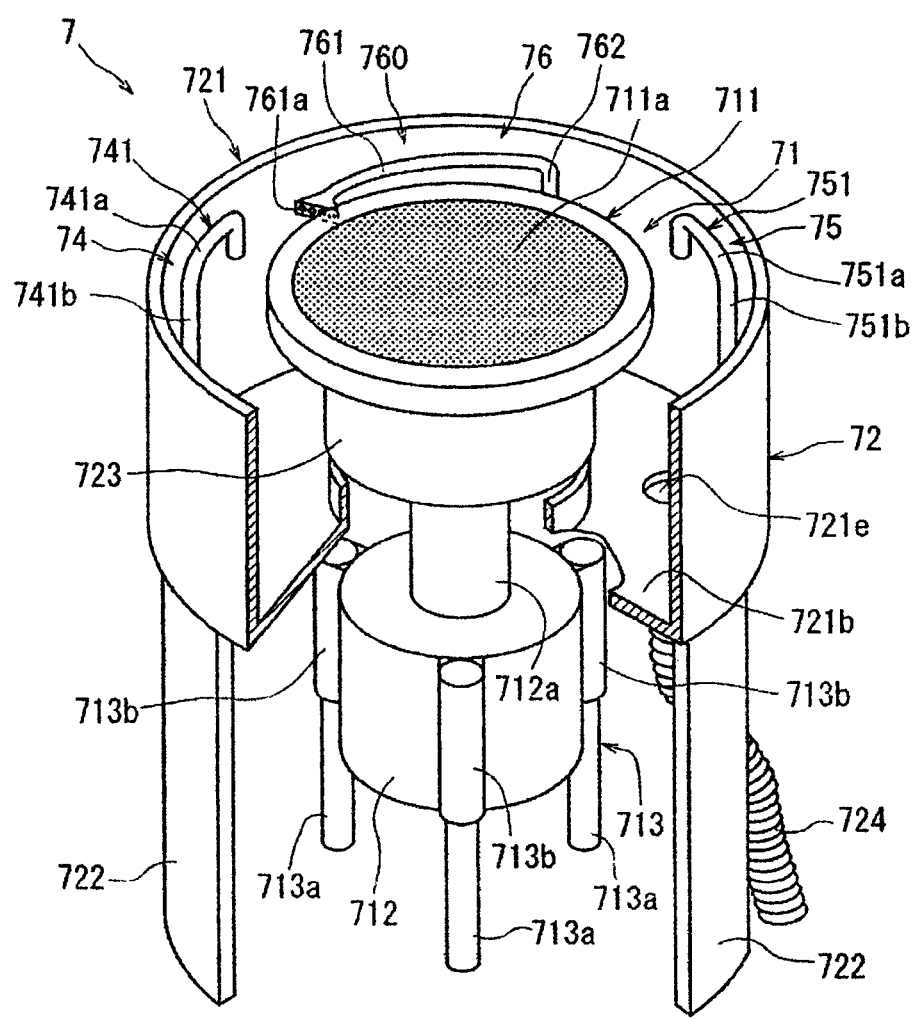
FIG. 2 is a partially cutaway perspective view of the protective film forming apparatus included in the laser processing apparatus shown in FIG. 1.
Figure 3:
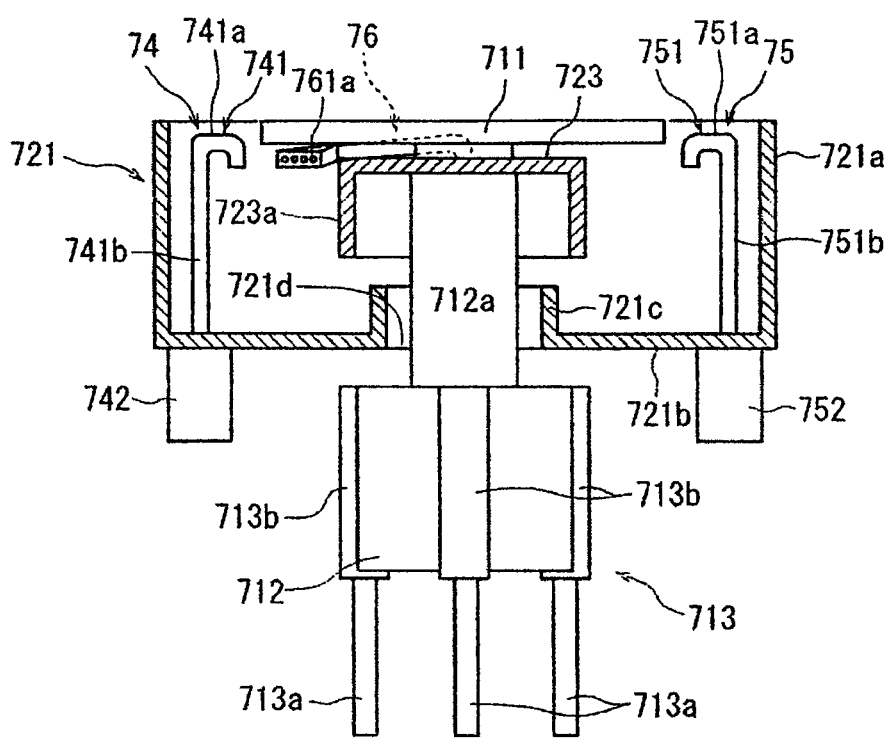
FIG. 3 is a sectional side view of the protective film forming apparatus shown in FIG. 2 in the condition where a spinner table is set at a standby position.
Figure 4:
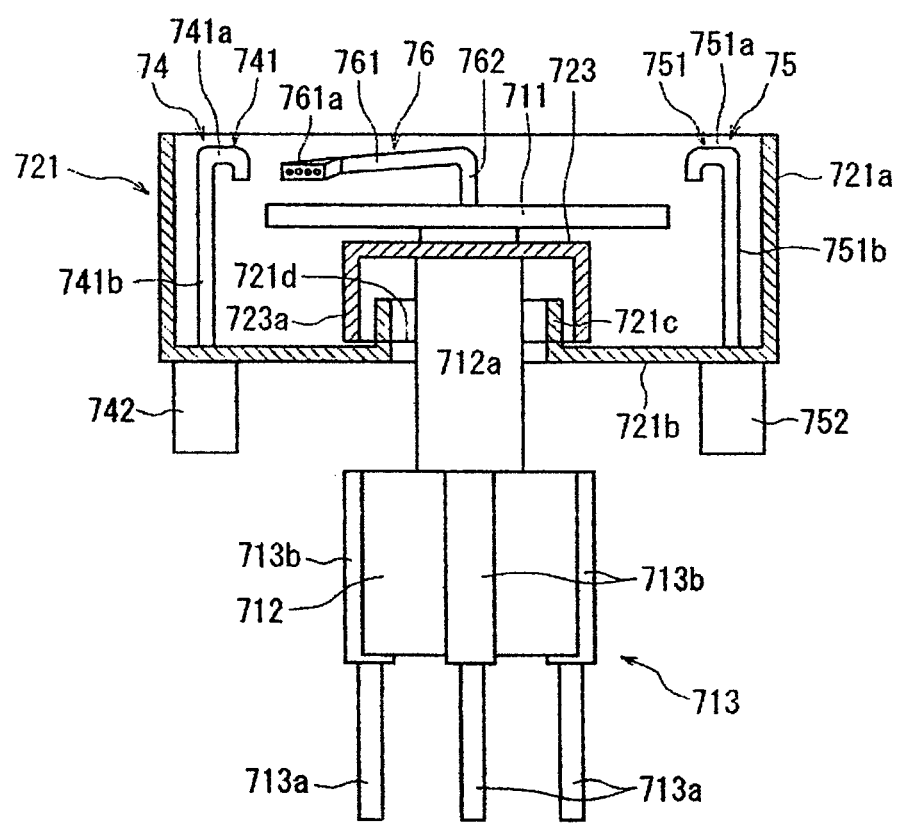
FIG. 4 is a view similar to FIG. 3, showing the condition that the spinner table is set at a working position.

The spinner table accommodating means 72 includes a receptacle 721, three support legs 722 for supporting the receptacle 721 (two of the three support legs 722 being shown in FIG. 2), and a cover member 723 mounted on the drive shaft 712a of the electric motor 712. As shown in FIGS. 3 and 4, the receptacle 721 is composed of a cylindrical outer wall 721a, a bottom wall 721b, and a cylindrical inner wall 721c. The bottom wall 721b is formed with a central hole 721d for allowing the insertion of the drive shaft 712a of the electric motor 712. The cylindrical inner wall 721c projects upward from the peripheral edge of the central hole 721d. As shown in FIG. 2, the bottom wall 721b is formed with a waste fluid outlet 721e, and a drain hose 724 is connected to the waste fluid outlet 721e. The cover member 723 is a cylindrical member having a closed top. The closed top of the cover member 723 is mounted to the upper end portion of the drive shaft 712a of the electric motor 712, and a covering portion 723a projects downward from the outer circumference of the closed top of the cover member 723. In the working position of the electric motor 712 and the spinner table 711 as shown in FIG. 4, the covering portion 723a of the cover member 723 is located so as to surround the cylindrical inner wall 721c of the receptacle 721 with a given gap defined therebetween.

The protective film forming apparatus 7 further includes water-soluble resin supplying means 74 for supplying a water-soluble resin in a liquid state to the front side (work surface) of the wafer as a workpiece held on the spinner table 711 before processing. The water-soluble resin supplying means 74 includes a water-soluble resin nozzle 741 for supplying the water-soluble resin toward the front side (work surface) of the wafer held on the spinner table 711 before processing and a reversible electric motor 742 (see FIGS. 3 and 4) for horizontally swinging the water-soluble resin nozzle 741. The water-soluble resin nozzle 741 is connected to a water-soluble resin source (not shown). The water-soluble resin nozzle 741 is composed of a horizontally extending nozzle portion 741a having a downward bent front end (discharge opening) and a support portion 741b extending downward from the base end of the nozzle portion 741a. The support portion 741b is inserted through a hole (not shown) formed through the bottom wall 721b of the receptacle 721 and is connected to the water-soluble resin source (not shown).

The protective film forming apparatus 7 further includes cleaning water supplying means 75 for supplying a cleaning water to the annular frame held on the spinner table 711 before processing and to the wafer held on the spinner table 711 after processing. The cleaning water supplying means 75 includes a cleaning water nozzle 751 for supplying the cleaning water for removing the water-soluble resin adhering to the upper surface of the annular frame held on the spinner table 711 before processing and also supplying the cleaning water toward the front side of the wafer held on the spinner table 711 after processing and a reversible electric motor 752 (see FIGS. 3 and 4) for horizontally swinging the cleaning water nozzle 751. The cleaning water nozzle 751 is connected to a cleaning water source (not shown). The cleaning water nozzle 751 is composed of a horizontally extending nozzle portion 751a having a downward bent front end (discharge opening) and a support portion 751b extending downward from the base end of the nozzle portion 751a. The support portion 751b is inserted through a hole (not shown) formed through the bottom wall 721b of the receptacle 721 and is connected to the cleaning water source (not shown).

The protective film forming apparatus 7 further includes air supplying means 76 for supplying air to the annular frame held on the spinner table 711 before processing. The air supplying means 76 includes an air nozzle 760 for supplying the air to the upper surface of the annular frame held on the spinner table 711 and a reversible electric motor (not shown) for horizontally swinging the air nozzle 760. The air nozzle 760 is connected to an air source (not shown). The air nozzle 760 is composed of a substantially horizontally extending nozzle portion 761 having a front end and a support portion 762 extending downward from the base end of the nozzle portion 761. The nozzle portion 761 is slightly inclined in such a manner that the front end is lower in level than the base end. Further, a plurality of discharge openings 761a are formed at the front end of the nozzle portion 761. The support portion 762 is inserted through a hole (not shown) formed through the bottom wall 721b of the receptacle 721 and is connected to the air source (not shown). The plural discharge openings 761a of the nozzle portion 761 are horizontally arranged in a line, and each discharge opening 761a is oriented slightly downward.

Referring back to FIG. 1, the laser processing apparatus 1 further includes a cassette setting portion 13a for setting a cassette 13 storing a semiconductor wafer 10 as a wafer to be laser-processed. The cassette setting portion 13a is provided with a cassette table 131 vertically movable by elevating means (not shown). The cassette 13 is set on the cassette table 131.

The laser processing apparatus 1 further includes temporary setting means 14 provided at a temporary setting portion 14a for temporarily setting the semiconductor wafer 10, wafer handling means 15 for taking the semiconductor wafer 10 out of the cassette 13 to the temporary setting means 14 before processing and for storing the semiconductor wafer 10 into the cassette 13 after processing, first transfer means 16 for transferring the semiconductor wafer 10 from the temporary setting means 14 to the protective film forming apparatus 7 before processing and for transferring the semiconductor wafer 10 from the protective film forming apparatus 7 to the temporary setting means 14 after processing, and second transfer means 17 for transferring the semiconductor wafer 10 from the protective film forming apparatus 7 to the chuck table 3 before processing and for transferring the semiconductor wafer 10 from the chuck table 3 to the protective film forming apparatus 7 after processing.

Figure 5:
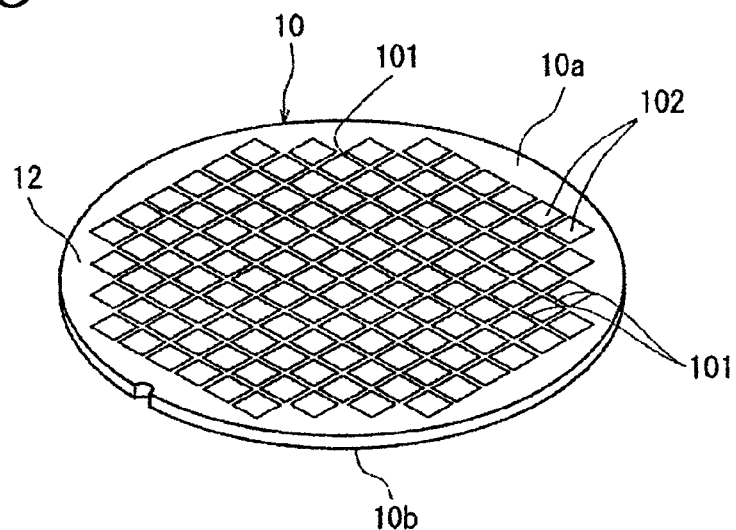
FIG. 5 is a perspective view of a semiconductor wafer as a workpiece.

There will now be described a wafer processing method for forming a protective film on the front side of a wafer as a workpiece and next laser-processing the wafer by using the laser processing apparatus 1 mentioned above. FIG. 5 is a perspective view of the semiconductor wafer 10 as the wafer to be laser-processed. The semiconductor wafer 10 shown in FIG. 5 is a silicon wafer, and it has a front side 10a and a back side 10b. The front side 10a of the semiconductor wafer 10 is partitioned into a plurality of rectangular regions by a plurality of crossing division lines 101, wherein a plurality of devices 102 such as ICs and LSIs are each formed in these plural rectangular regions.

Figure 6:
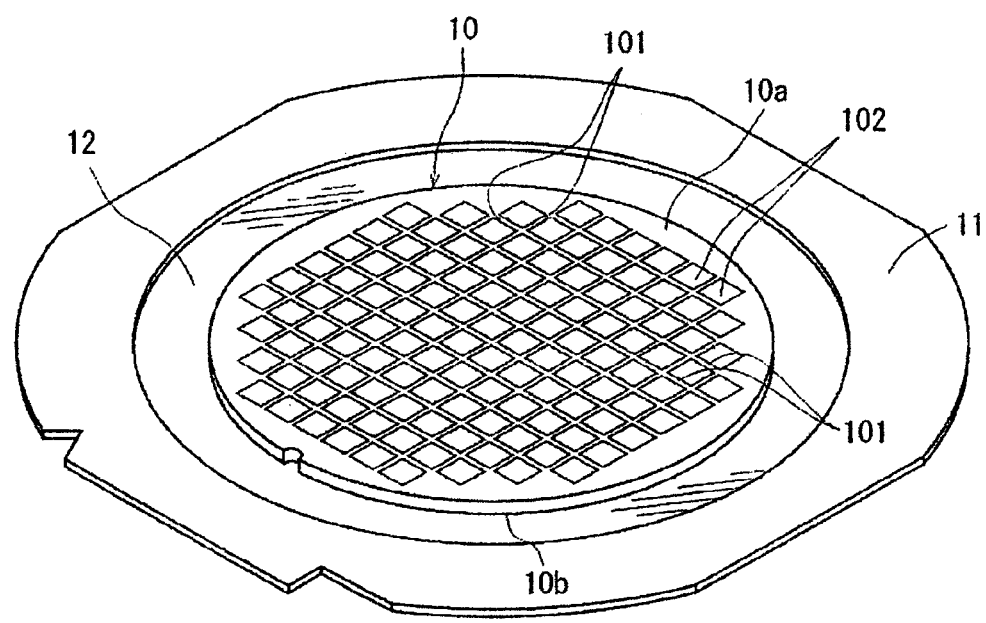
FIG. 6 is a perspective view of the semiconductor wafer in the condition obtained by performing a wafer supporting step.

In forming a protective film on the front side 10a of the semiconductor wafer 10 and next performing laser processing along the division lines 101, a wafer supporting step is first performed in such a manner that the back side 10*b* of the semiconductor wafer 10 is attached to an adhesive tape supported to an annular frame having an inside opening for receiving the semiconductor wafer 10, whereby the semiconductor wafer 10 is supported through the adhesive tape to the annular frame. More specifically, as shown in FIG. 6, an adhesive tape 12 is supported at its peripheral portion to an annular frame 11 having an inside opening in such a manner that the inside of the opening of the annular frame 11 is closed by the adhesive tape 12. The back side 10*b* of the semiconductor wafer 10 is attached to the upper surface (adhesive surface) of the adhesive tape 12 in its central portion exposed to the inside opening of the annular frame 11. Accordingly, the semiconductor wafer 10 is supported through the adhesive tape 12 to the annular frame 11. While the back side 10*b* of the semiconductor wafer 10 is attached to the upper surface of the adhesive tape 12 previously supported at its peripheral portion to the annular frame 11 in this preferred embodiment shown in FIG. 6, the central portion of the adhesive tape 12 may be attached to the back side 10*b* of the semiconductor wafer 10 and at the same time the peripheral portion of the adhesive tape 12 may be attached to the annular frame 11. The semiconductor wafer 10 supported through the adhesive tape 12 to the annular frame 11 is stored in the cassette 13 shown in FIG. 1 in the condition where the front side 10*a* (work surface) of the semiconductor wafer 10 is oriented upward.

The semiconductor wafer 10 supported through the adhesive tape 12 to the annular frame 11 will be hereinafter referred to simply as the semiconductor wafer 10. The semiconductor wafer 10 is stored at a predetermined position in the cassette 13. The cassette table 131 is vertically moved by the elevating means (not shown) to thereby vertically move the cassette 13 to a position where the semiconductor wafer 10 is to be taken out. The wafer handling means 15 is next operated to take the semiconductor wafer 10 out of the cassette 13 and then carry the semiconductor wafer 10 to the temporary setting means 14 provided at the temporary setting portion 14*a*. The semiconductor wafer 10 carried to the temporary setting means 14 is positioned (centered) by the temporary setting means 14. Thereafter, the semiconductor wafer 10 is transferred from the temporary setting means 14 to the vacuum chuck 711*a* of the spinner table 711 constituting the protective film forming apparatus 7 by the rotational operation of the first transfer means 16. The semiconductor wafer 10 placed on the vacuum chuck 711*a* is next held under suction on the vacuum chuck 711*a* by operating the suction means (not shown) in the condition where the adhesive tape 12 is in contact with the upper surface of the spinner table 711 (wafer holding step). At this time, the spinner table 711 is set at the standby position shown in FIG. 3. Further, the water-soluble resin nozzle 741 of the water-soluble resin supplying means 74, the cleaning water nozzle 751 of the cleaning water supplying means 75, and the air nozzle 760 of the air supplying means 76 are all set at their standby positions where they are retracted from the spinner table 711 as shown in FIGS. 2 and 3.

Figure 7A:
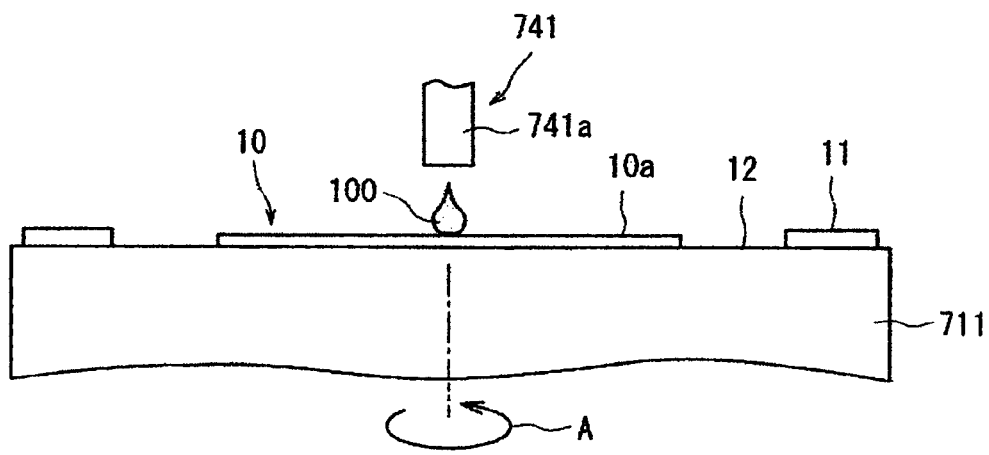
FIGS. 7A and 7B are views for illustrating a protective film forming step.

After performing the wafer holding step to hold the semiconductor wafer 10 on the spinner table 711 of the protective film forming apparatus 7, the spinner table 711 is lowered to the working position shown in FIG. 4. In this working position, the electric motor 742 of the water-soluble resin supplying means 74 is operated to swing the water-soluble resin nozzle 741 so that the discharge opening (front end) of the nozzle portion 741*a* of the water-soluble resin nozzle 741 comes to a position directly above the center of the front side 10*a* of the semiconductor wafer 10 held on the spinner table 711 as shown in FIG. 7A. Thereafter, the spinner table 711 is rotated in the direction shown by an arrow A in FIG. 7A at a predetermined speed (e.g., 60 rpm) for a predetermined time period (e.g., 100 seconds). At the same time, a water-soluble resin 100 in a liquid state is dropped in a predetermined amount (e.g., approximately 4 to 5 mL/minute) from the discharge opening of the nozzle portion 741*a* of the water-soluble resin nozzle 741 onto the center of the front side 10*a* of the semiconductor wafer 10. For example, PVA is used as the water-soluble resin 100.

Figure 7B:
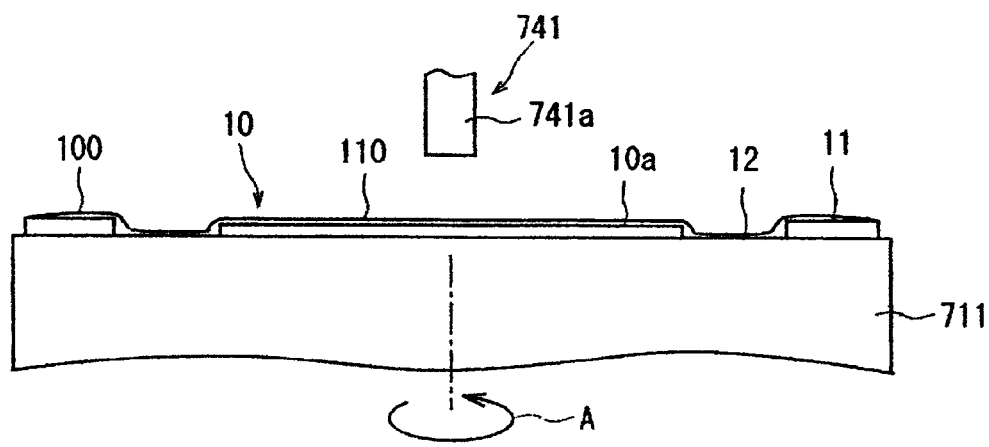

In this manner, the water-soluble resin 100 such as PVA is dropped at a rate of approximately 4 to 5 mL/minute onto the center of the front side 10*a* (work surface) of the semiconductor wafer 10 held on the spinner table 711 before laser processing, and the spinner table 711 is rotated at 60 rpm for 100 seconds, for example. In this case, a protective film 110 having a thickness of 0.2 to 1 μm is formed on the front side 10*a* (work surface) of the semiconductor wafer 10 as shown in FIG. 7B (protective film forming step). In this protective film forming step, the water-soluble resin 100 flows or scatters toward the annular frame 11 due to a centrifugal force, so that the water-soluble resin 100 adheres to the upper surface of the annular frame 11 as shown in FIG. 7B.

Figure 8A:
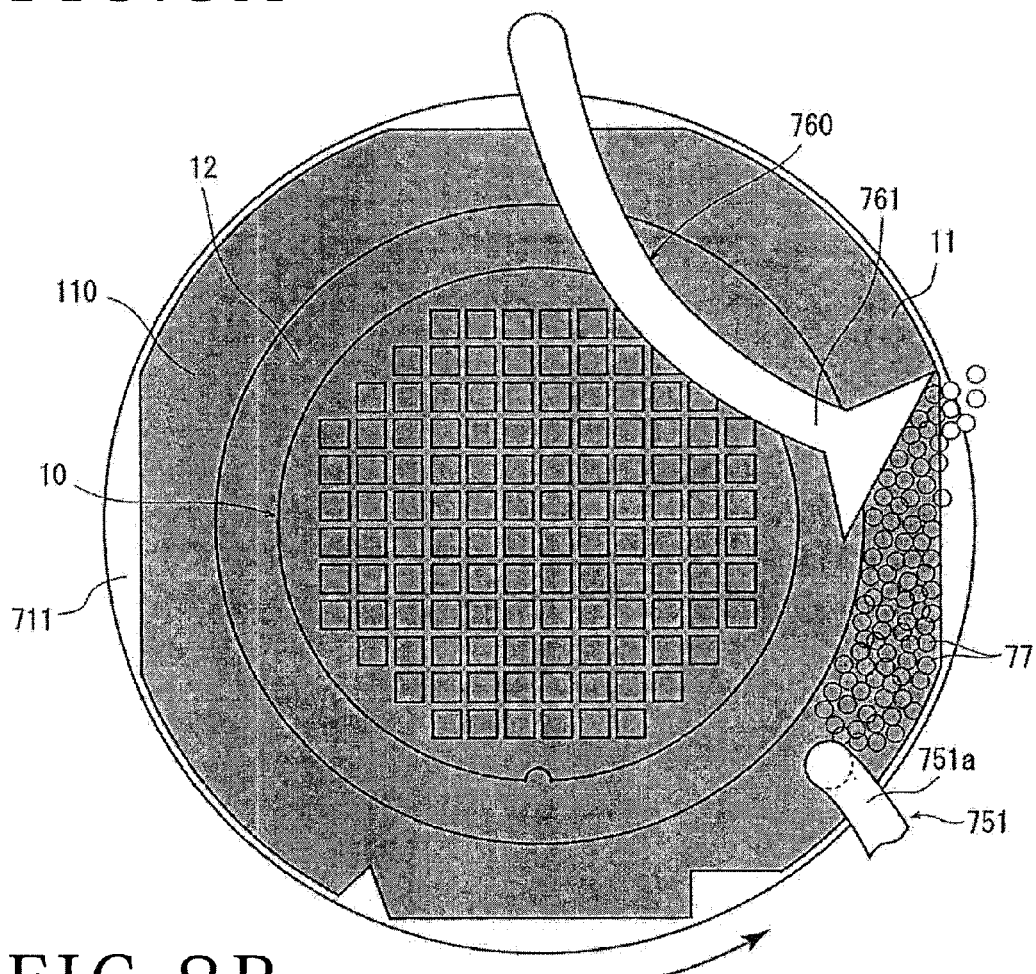
FIGS. 8A and 8B are views for illustrating a water-soluble resin removing step.

After performing the protective film forming step, a water-soluble resin removing step is performed to remove the water-soluble resin 100 from the upper surface of the annular frame 11. In the water-soluble resin removing step, the electric motor 752 of the cleaning water supplying means 75 is operated to swing the cleaning water nozzle 751 so that the discharge opening (front end) of the nozzle portion 751*a* of the cleaning water nozzle 751 comes to a position directly above the annular frame 11 held on the spinner table 711 as shown in FIG. 8A. Further, the electric motor (not shown) of the air supplying means 76 is operated to swing the air nozzle 760 so that the front end (having the plural discharge openings 761*a* as shown in FIG. 2) of the nozzle portion 761 of the air nozzle 760 comes to a position adjacent to the nozzle portion 751*a* of the cleaning water nozzle 751 on the downstream side thereof in the rotational direction of the spinner table 711. At this time, the plural discharge openings 761*a* (see FIG. 2) formed at the front end of the nozzle portion 761 are so positioned as to be obliquely oriented from the inside of the annular frame 11 toward the outside thereof, in order to prevent damage to the protective film 110 formed on the front side 10*a* of the semiconductor wafer 10.

Figure 8B:
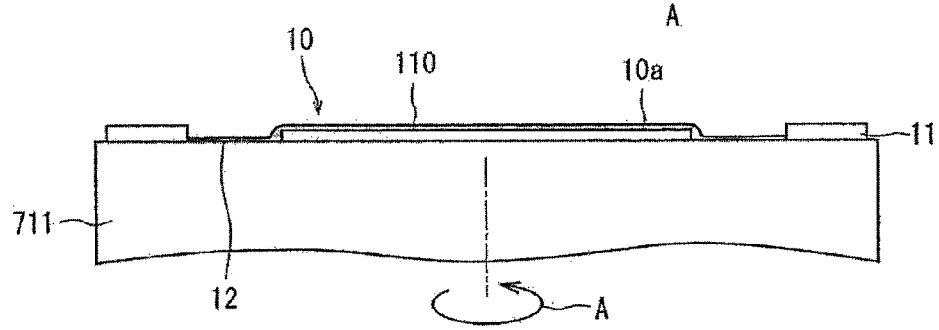

In this condition, the spinner table 711 is rotated in the direction shown by an arrow A in FIG. 8A at a speed of 90 rpm, for example. At the same time, a cleaning water 77 is supplied at a rate of 140 mL/minute from the discharge opening of the nozzle portion 751*a* and air is supplied at a rate of 3 L/minute for 15 seconds from the discharge openings 761*a* of the nozzle portion 761 of the air nozzle 760. As a result, the cleaning water 77 is supplied to the upper surface of the annular frame 11. On the other hand, the air is supplied from the discharge openings 761*a* of the nozzle portion 761 positioned on the downstream side of the nozzle portion 751*a* in the rotational direction of the spinner table 711, so that the air is supplied against the flow of the cleaning water 77 on the upper surface of the annular frame 11. Accordingly, the cleaning water 77 is forced to temporarily stay on the upper surface of the annular frame 11 by the air supplied and is then expelled outward of the annular frame 11. By performing this operation, the water-soluble resin adhering to the upper surface of the annular frame 11 is dissolved in the cleaning water 77 temporarily staying on the upper surface of the annular frame 11, thereby improving a cleaning effect. Accordingly, the water-soluble resin adhering to the upper surface of the annular frame 11 can be effectively removed in a short period of time as shown in FIG. 8B.

After forming the protective film 110 on the front side 10a (work surface) of the semiconductor wafer 10 and then removing the water-soluble resin from the upper surface of the annular frame 11 as mentioned above, the spinner table 711 is raised to the standby position shown in FIG. 3 and the suction holding of the semiconductor wafer 10 held on the spinner table 711 is canceled. Next, the semiconductor wafer 10 is transferred from the spinner table 711 to the vacuum chuck 32 of the chuck table 3 by the second transfer means 17. At this time, the second transfer means 17 operates to hold the upper surface of the annular frame 11 supporting the semiconductor wafer 10 through the adhesive tape 12, under suction, in transferring the semiconductor wafer 10. Since the water-soluble resin has been removed from the upper surface of the annular frame 11 as mentioned above, there is no possibility that the water-soluble resin may act like an adhesive to interfere with the separation of the annular frame 11 from the second transfer means 17 in placing the semiconductor wafer 10 on the chuck table 3.

After transferring the semiconductor wafer 10 from the spinner table 711 to the vacuum chuck 32 of the chuck table 3 as mentioned above, the suction means (not shown) connected to the chuck table 3 is operated to hold the semiconductor wafer 10 through the adhesive tape 12 on the vacuum chuck 32 under suction. Further, the annular frame 11 is fixed by the clamps 34. At this time, since the water-soluble resin has been removed from the upper surface of the annular frame 11 as mentioned above, there is no possibility that the water-soluble resin may act like an adhesive to bond the clamps 34 to the annular frame 11. Thereafter, the chuck table 3 holding the semiconductor wafer 10 is moved to a position directly below the imaging means 5 adjacent to the laser beam applying means 4 by operating feeding means (not shown).

When the chuck table 3 is positioned directly below the imaging means 5 as mentioned above, the imaging means 5 and the control means (not shown) perform image processing such as pattern matching for making the alignment between each division line 101 extending in a first direction on the front side 10a of the semiconductor wafer 10 and the focusing means 42 of the laser beam applying means 4 for applying a laser beam along each division line 101. Thus, the alignment of a laser beam applying position to each division line 101 extending in the first direction is performed. Similarly, the alignment of a laser beam applying position to each division line 101 extending in a second direction perpendicular to the first direction is also performed. In the case that the protective film 110 formed on the front side 10a of the semiconductor wafer 10 is not transparent, infrared radiation may be applied from the imaging means 5 to the front side 10a of the semiconductor wafer 10 to image the division lines 101 formed on the front side 10a of the semiconductor wafer 10, thus performing the alignment from the front side 10a.

Figure 9A:
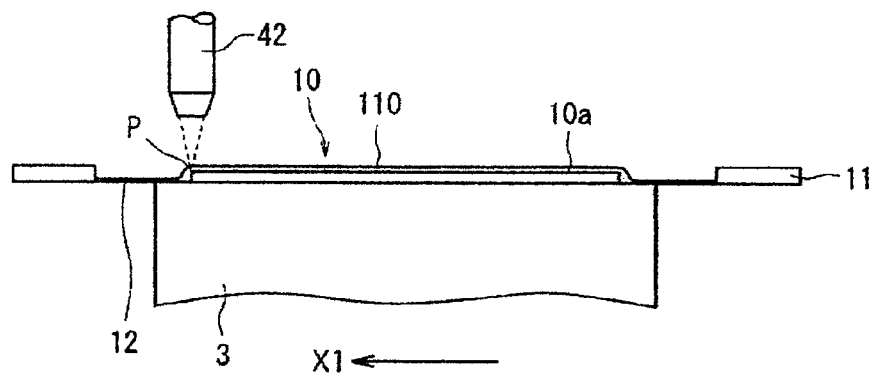
FIGS. 9A to 9C are views for illustrating a laser processed groove forming step to be performed by laser beam applying means included in the laser processing apparatus shown in FIG. 1.
Figure 9B:
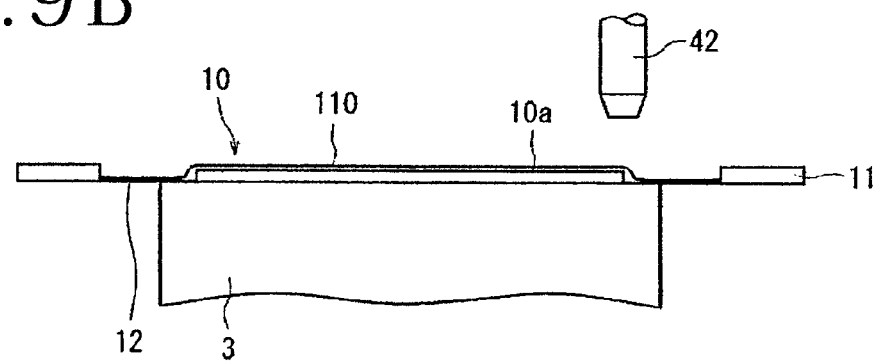

After performing the alignment of the laser beam applying position to detect all the division lines 101 formed on the front side 10a of the semiconductor wafer 10 held on the chuck table 3, the chuck table 3 is moved to a laser beam applying area where the focusing means 42 of the laser beam applying means 4 is located as shown in FIG. 9A, and a predetermined one of the division lines 101 extending in the first direction is positioned directly below the focusing means 42. At this time, the semiconductor wafer 10 is set so that one end (left end as viewed in FIG. 9A) of this predetermined division line 101 is positioned directly below the focusing means 42 as shown in FIG. 9A. In FIGS. 9A and 9B, the clamps 34 for fixing the annular frame 11 are not shown. Thereafter, a pulsed laser beam is applied from the focusing means 42 of the laser beam applying means 4 to the front side 10a of the semiconductor wafer 10 as moving the chuck table 3 holding the semiconductor wafer 10 in the direction shown by an arrow X1 in FIG. 9A at a predetermined feed speed. When the other end (right end as viewed in FIG. 9B) of the predetermined division line 101 comes to the position directly below the focusing means 42 as shown in FIG. 9B, the application of the pulsed laser beam is stopped and the movement of the chuck table 3 is also stopped (laser processed groove forming step). In this laser processed groove forming step, the focal point P of the pulsed laser beam is set near the upper surface of the predetermined division line 101.

Figure 9C:
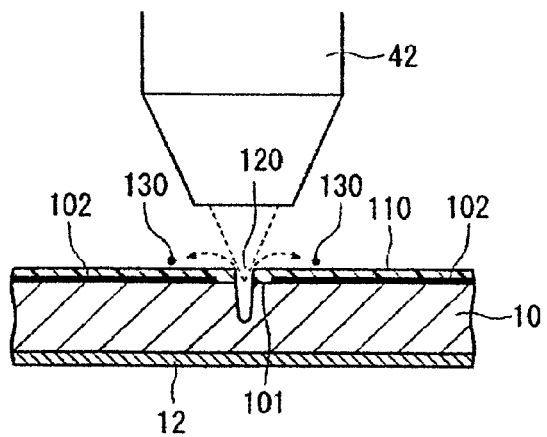

By performing this laser processed groove forming step, a laser processed groove 120 is formed along the predetermined division line 101 as shown in FIG. 9C. At this time, even when debris 130 is generated by the application of the pulsed laser beam as shown in FIG. 9C, the debris 130 is blocked by the protective film 110, so that the debris 130 is prevented from sticking to the devices 102 and bonding pads (not shown). This laser processed groove forming step is performed for all of the other division lines 101 extending in the first direction and in the second direction perpendicular to the first direction on the front side 10a of the semiconductor wafer 10 to thereby form a similar laser processed groove 120 along each division line 101.

After performing the laser processed groove forming step along all of the division lines 101 of the semiconductor wafer 10, the chuck table 3 holding the semiconductor wafer 10 is returned to the initial position shown in FIG. 1 and the suction holding of the semiconductor wafer 10 is canceled. Further, the fixing of the annular frame 11 by the clamps 34 is also canceled. Thereafter, the semiconductor wafer 10 is transferred from the chuck table 3 to the vacuum chuck 711a of the spinner table 711 of the protective film forming apparatus 7 by the second transfer means 17. The semiconductor wafer 10 thus transferred to the vacuum chuck 711a is held under suction. At this time, the upper surface of the annular frame 11 supporting the semiconductor wafer 10 through the adhesive tape 12 is held under suction by the second transfer means 17 in transferring the semiconductor wafer 10 from the chuck table 3 to the spinner table 711. Since the water-soluble resin has already been removed from the upper surface of the annular frame 11 as mentioned above, there is no possibility that the water-soluble resin may act like an adhesive to interfere with the separation of the annular frame 11 from the second transfer means 17 in placing the semiconductor wafer 10 on the spinner table 711. At this time, the water-soluble resin nozzle 741 of the water-soluble resin supplying means 74, the cleaning water nozzle 751 of the cleaning water supplying means 75, and the air nozzle 760 of the air supplying means 76 are all set in their standby positions where they are retracted from the spinner table 711 as shown in FIGS. 2 and 3.

In the condition where the semiconductor wafer 10 is held on the spinner table 711 of the protective film forming apparatus 7 after laser processing as mentioned above, a cleaning step of cleaning the semiconductor wafer 10 is performed in such a manner that the spinner table 711 is lowered to the working position shown in FIG. 4 and the electric motor 752 of the cleaning water supplying means 75 is operated to move the front end (discharge opening) of the nozzle portion 751a of the cleaning water nozzle 751 to the position directly above the center of the semiconductor wafer 10 held on the spinner table 711. Thereafter, the spinner table 711 is rotated at 800 rpm, for example, and a cleaning water is discharged at a pressure of approximately 0.2 MPa, for example, from the discharge opening of the nozzle portion 751a, thereby cleaning the front side 10a (work surface) of the semiconductor wafer 10. At this time, the electric motor 752 is operated to swing the nozzle portion 751a of the cleaning water nozzle 751 in a required angular range from the center of the semiconductor wafer 10 to the outer circumference thereof. As a result, the protective film 110 formed on the front side 10a of the semiconductor wafer 10 can be easily removed by the cleaning water because the protective film 110 is formed of a water-soluble resin. At the same time, the debris 130 generated in laser processing is also removed together with the protective film 110.

After performing the cleaning step mentioned above, a drying step of drying the semiconductor wafer 10 cleaned above is performed in such a manner that the cleaning water nozzle 751 is returned to its standby position and the spinner table 711 is rotated at 3000 rpm for approximately 15 seconds, for example, thereby spin-drying the front side 10a of the semiconductor wafer 10.

After performing the drying step mentioned above, the rotation of the spinner table 711 is stopped and the spinner table 711 is raised to the standby position shown in FIG. 3. Further, the suction holding of the semiconductor wafer 10 held on the spinner table 711 is canceled. Thereafter, the semiconductor wafer 10 is transferred from the spinner table 711 to the temporary setting means 14 by the first transfer means 16. Finally, the semiconductor wafer 10 is carried from the temporary setting means 14 to the cassette 13 and stored into the cassette 13 at a predetermined position by the wafer handling means 15.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective film forming method for forming a protective film of a water-soluble resin on a front side of a wafer, the front side of said wafer being partitioned by a plurality of crossing division lines to thereby define a plurality of separate regions where a plurality of devices are each formed, said protective film forming method comprising:
   a wafer supporting step of attaching a back side of said wafer to an adhesive tape supported to an annular frame having an inside opening for receiving said wafer, thereby supporting said wafer through said adhesive tape to said annular frame;
   a wafer holding step of holding said wafer supported through said adhesive tape to said annular frame on a spinner table in a condition where the front side of said wafer is oriented upward;
   a protective film forming step of rotating said spinner table and dropping said water-soluble resin onto a center of the front side of said wafer to thereby form said protective film of said water-soluble resin on the front side of said wafer; and
   a water-soluble resin removing step of removing said water-soluble resin scattered onto an upper surface of said annular frame in said protective film forming step;
   said water-soluble resin removing step including the steps of rotating said spinner table, positioning a cleaning water nozzle above the upper surface of said annular frame held on said spinner table, supplying a cleaning water from said cleaning water nozzle to the upper surface of said annular frame, positioning an air nozzle adjacent to said cleaning water nozzle on a downstream side thereof in a rotational direction of said spinner table, and supplying air from said air nozzle against the flow of said cleaning water on the upper surface of said annular frame, whereby said cleaning water is forced to temporarily stay on the upper surface of said annular frame by said air supplied and is then expelled outward of said annular frame.

* * * * *